United States Patent
Okuno

(10) Patent No.: US 10,965,292 B1
(45) Date of Patent: Mar. 30, 2021

(54) DELAY-LOCKED LOOP DEVICE AND OPERATION METHOD THEREFOR

(71) Applicant: Winbond Electronics Corp., Taichung (TW)

(72) Inventor: Shinya Okuno, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/896,206

(22) Filed: Jun. 8, 2020

(51) Int. Cl.
*H03L 7/081* (2006.01)
*H03L 7/085* (2006.01)

(52) U.S. Cl.
CPC ............ *H03L 7/0816* (2013.01); *H03L 7/085* (2013.01); *H03L 7/0814* (2013.01)

(58) Field of Classification Search
None
See application file for complete search history.

(56) References Cited

U.S. PATENT DOCUMENTS

| | | | |
|---|---|---|---|
| 7,046,060 B1 | 5/2006 | Minzoni et al. | |
| 8,144,529 B2 * | 3/2012 | Chuang | G11C 7/222 365/194 |
| 8,749,281 B2 * | 6/2014 | Seo | H03L 7/0814 327/156 |
| 8,769,194 B2 | 7/2014 | Fujisawa | |
| 2005/0206426 A1 | 9/2005 | Proebsting et al. | |
| 2010/0090736 A1 | 4/2010 | Kim et al. | |

FOREIGN PATENT DOCUMENTS

| | | |
|---|---|---|
| CN | 109150163 | 1/2019 |
| JP | H096462 | 1/1997 |
| JP | 2009177778 | 8/2009 |
| JP | 2012094205 | 5/2012 |
| TW | I488440 | 6/2015 |
| WO | 2014119558 | 8/2014 |

OTHER PUBLICATIONS

"Office Action of Japan Counterpart Application", dated Nov. 24, 2020, p. 1-p. 4.

* cited by examiner

*Primary Examiner* — Jeffery S Zweizig
(74) *Attorney, Agent, or Firm* — JCIPRNET

(57) ABSTRACT

A DLL device and an operation method for the DLL device are provided. The DLL device includes a delay line, a replica circuit, a phase detector, and a delay controller. The delay line delays an input clock in response to a delay code to provide a delayed clock. The replica circuit generates a feedback clock according to the delayed clock. The phase detector compares the input clock with the feedback clock to generate a delay control signal. The delay controller generates the delay code at a first time point according to the delay control signal based on a control clock and delays a replica delay time length to provide the delay code to the delay line at a second time point. The delay line adjusts the input clock at the second time point. A cycle of the control clock is adjusted to be larger than the replica delay time length.

13 Claims, 8 Drawing Sheets

DELAY-LOCKED LOOP DEVICE AND OPERATION METHOD THEREFOR

BACKGROUND

Technical Field

The disclosure relates to a delay-locked loop (DLL) device and an operation method for the DLL device, and particularly to a DLL device applicable to a cycle of any input clock and an operation method for the DLL device.

Description of Related Art

Generally, a DLL may be set to adjust a received input clock to an expected delay clock within a preset cycle. However, in a case that the cycle of the input clock is small, an issue of over shift may frequently arise in the DLL, thus resulting in insufficient delay or excessive delay of the delay clock. In a case that the cycle of the input clock is large, the over shift issue in the DLL may be improved, but the DLL may not be able to adjust the received input clock to the expected delay clock within the preset cycle.

Therefore, developing a DLL device applicable to a cycle of any input clock is one of the research topics to which a person skilled in the art is dedicated.

SUMMARY

A DLL device applicable to a cycle of any input clock and an operation method for the DLL device are provided.

According to an embodiment of the disclosure, a DLL device includes a delay line, a replica circuit, a phase detector, and a delay controller. The delay line is configured to receive an input clock and delay the input clock in response to a multi-bit delay code to provide a delayed clock. The replica circuit is coupled to the delay line. The replica circuit is configured to receive the delayed clock and generate a feedback clock according to the delayed clock. The phase detector is coupled to the replica circuit. The phase detector is configured to receive the input clock and the feedback clock and compare the input clock with the feedback clock to generate a delay control signal. The delay controller is coupled to the phase detector and the delay line. The delay controller is configured to generate the delay code at a first time point according to the delay control signal based on a control clock, delay a replica delay time length to provide the delay code to the delay line at a second time point, and control the delay line to adjust timing of the input clock at the second time point. A cycle of the control clock is adjusted to be larger than the replica delay time length.

According to an embodiment of the disclosure, an operation method is applied to a DLL device. The operation method includes: receiving an input clock and delaying the input clock in response to a multi-bit delay code to provide a delayed clock; generating a feedback clock according to the delayed clock; comparing the input clock with the feedback clock to generate a delay control signal; generating the delay code at a first time point according to the delay control signal based on a control clock, delaying a replica delay time length to provide the delay code at a second time point, and adjusting timing of the input clock at the second time point, where a cycle of the control clock is adjusted to be larger than the replica delay time length.

Based on the above, in the DLL device and according to the operation method for the DLL device, the cycle of the control clock is adjusted to be larger than the replica delay time length, and the delay code may be provided based on the control, so that the delay code adjusts a phase of the input clock after the replica delay time length. Thereby, the DLL device and the operation method therefor as provided in one or more embodiments of the disclosure are applicable to the cycle of any input clock.

In order to make the above features of the disclosure comprehensible, embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
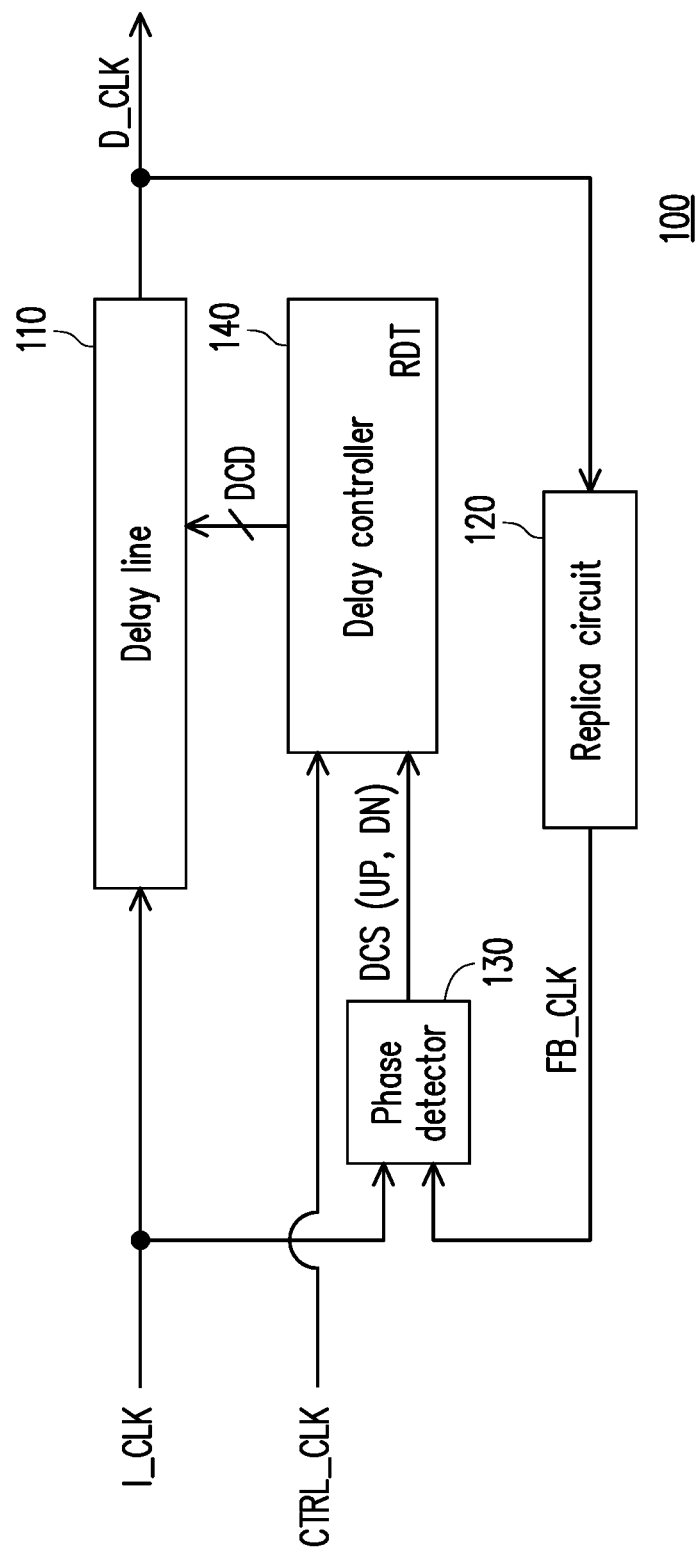
FIG. 1 is a schematic diagram of a DLL device according to a first embodiment of the disclosure.

Some embodiments of the disclosure are described in detail below with reference to the accompanying drawings. Reference numerals referenced in the following description are regarded as identical or similar elements when identical reference numerals appear in different drawings. The embodiments are only a part of the disclosure, and do not disclose all implementable manners of the disclosure. More exactly, the embodiments are only examples of devices in the scope of the claims of the disclosure.

FIG. 1 is a schematic diagram of a DLL device according to a first embodiment of the disclosure. A DLL device 100 includes a delay line 110, a replica circuit 120, a phase detector 130, and a delay controller 140. The delay line 110 receives an input clock I_CLK, and delays the input clock I_CLK in response to a multi-bit delay code DCD to provide a delayed clock D_CLK. The replica circuit 120 is coupled to the delay line 110. The replica circuit 120 receives the delayed clock D_CLK from the delay line 110, and generates a feedback clock FB_CLK according to the delayed clock D_CLK. The phase detector 130 is coupled to the replica circuit 120. The phase detector 130 receives the input clock I_CLK and the feedback clock FB_CLK, and compares the input clock I_CLK with the feedback clock FB_CLK to generate a delay control signal DCS.

The delay controller 140 is coupled to the phase detector 130 and the delay line 110. The delay controller 140 generates the delay code DCD at a first time point according to the delay control signal DCS based on a control clock CTRL_CLK. In the embodiment, the delay control signal DCS includes delay instructions UP and DN. The delay controller 140 may increase a value of the delay code DCD according to the delay instruction UP. The delay line 110 may increase a delay of the input clock I_CLK according to the delay code DCD whose value is increased. On the other hand, the delay controller 140 may decrease the value of the delay code DCD according to the delay instruction DN. The delay line 110 may decrease the delay of the input clock I_CLK according to the delay code DCD whose value is decreased. When the delay controller 140 generates the delay code DCD at a first time point, a replica delay time length RDT may be delayed to provide the delay code DCD to the delay line 110 at a second time point. Therefore, the delay line 110 may adjust timing of the input clock I_CLK at the second time point. In the embodiment, a cycle of the control clock CTRL_CLK is adjusted to be larger than the replica delay time length RDT and smaller than a time length of a sum of the replica delay time length RDT and a cycle of the input clock I_CLK. Next, after the second time point, the delay controller 140 may provide another delay code DCD based on the control clock CTRL_CLK.

It is worth mentioning that the cycle of the control clock CTRL_CLK is adjusted to be larger than the replica delay time length RDT. That is to say, the DLL device 100 follows the replica delay time length RDT to adjust the cycle of the control clock CTRL_CLK, and the cycle of the control clock CTRL_CLK may be slightly larger than the replica delay time length RDT. The delay controller 140 can generate another delay code DCD immediately (i.e., in a time interval of a cycle of at least one input clock I_CLK) after the feedback clock FB_CLK is provided. For example, the cycle of the control clock CTRL_CLK is adjusted to be larger than the replica delay time length RDT and smaller than a time length of a sum of the replica delay time length RDT and a cycle of a single input clock I_CLK. For another example, the cycle of the control clock CTRL_CLK is adjusted to be larger than the replica delay time length RDT and smaller than a time length of a sum of the replica delay time length RDT and cycles of two input clocks I_CLK. Therefore, the delay controller 140 can generate another delay code DCD immediately (i.e., in a time interval of a cycle(s) of one or two input clocks I_CLK) after the feedback clock FB_CLK is provided. Therefore, in a case that the cycle of the input clock I_CLK is small, there may be no over shift in the DLL device 100. In addition, in a case that the cycle of the input clock I_CLK is large, the DLL device 100 adjusts the cycle of the control clock CTRL_CLK according to the replica delay time length RDT. Therefore, a time length during which the DLL device 100 adjusts the input clock I_CLK to an expected delay clock D_CLK may not be prolonged. Thereby, the DLL device 100 is applicable to the cycle of any input clock I_CLK, and can adjust a received input clock I_CLK to an expected delay clock D_CLK within a specified preset cycle.

Figure 2A:
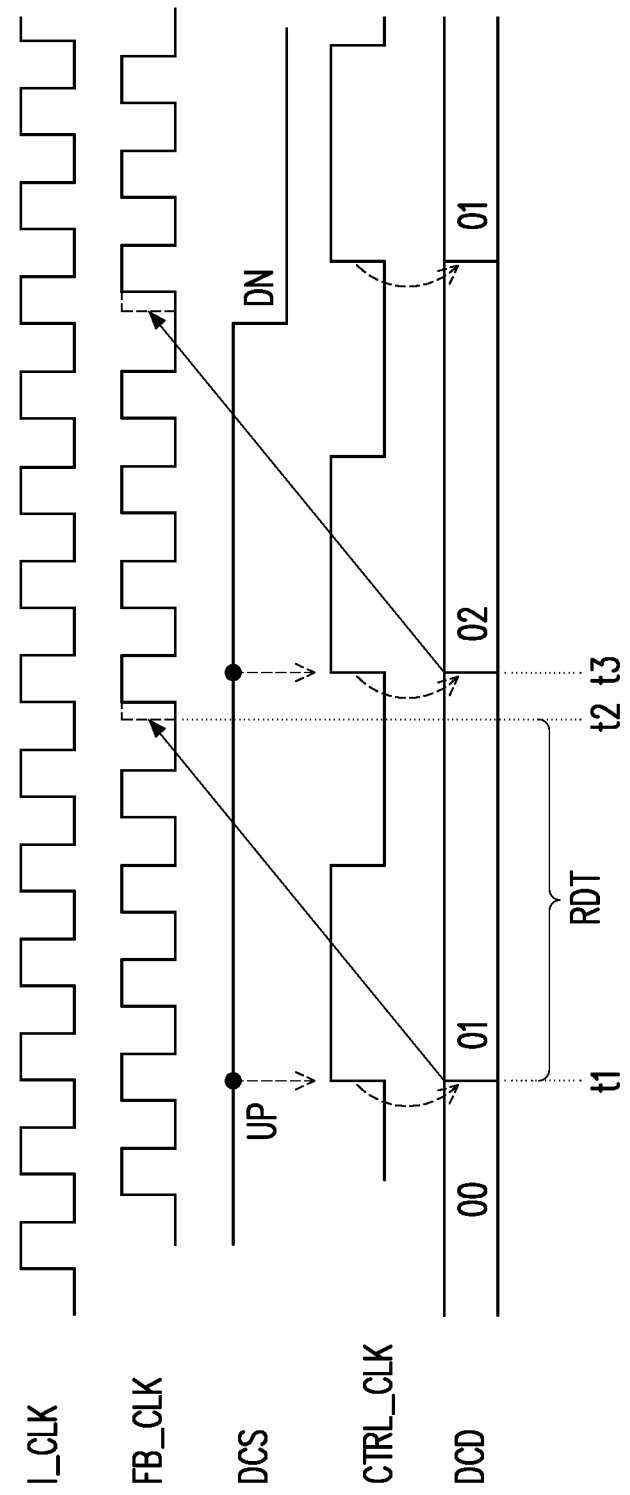
FIG. 2A is a diagram of signal timing applied to an input clock having a minimum cycle according to an embodiment of the disclosure.

For example, please refer to FIG. 1 and FIG. 2A together. FIG. 2A is a diagram of signal timing applied to an input clock having a minimum cycle according to an embodiment of the disclosure. The diagram of signal timing in the embodiment is applicable to the DLL device 100. The delay controller 140 may increase a value of the delay code DCD according to the delay instruction UP to increase the delay of the input clock I_CLK. On the other hand, the delay controller 140 may decrease the value of the delay code DCD according to the delay instruction DN to decrease the delay of the input clock I_CLK. In the embodiment, the delay controller 140 generates the delay code DCD at a first time point t1 according to the delay control signal DCS based on a control clock CTRL_CLK. In the embodiment, the delay controller 140 may generate a delay code DCD associated with the delay control signal DCS based on a rising edge of the control clock CTRL_CLK. In some embodiments, the delay controller 140 may generate the delay code DCD associated with the delay control signal DCS based on a falling edge of the control clock CTRL_CLK. The delay line 110 may adjust timing of the input clock I_CLK at a second time point t2. Relative to the first time point t1, the second time point t2 has a delay of the replica delay time length RDT. In the embodiment, the cycle of the control clock CTRL_CLK is adjusted to be larger than the replica delay time length RDT. Therefore, the delay controller 140 may generate another delay code DCD at a third time point t3 after the second time point t2 based on the control clock CTRL_CLK. A time length between the third time point t3 and the first time point t1 is substantially equal to the cycle of the control clock CTRL_CLK.

In the embodiment, the cycle of the control clock CTRL_CLK depends on the replica delay time length RDT. Therefore, the delay controller 140 can generate another delay code DCD in a time interval of a cycle of a single input clock I_CLK or a cycle of a single feedback clock FB_CLK (the cycle of the input clock I_CLK is substantially equal to the cycle of the feedback clock FB_CLK) after the feedback clock FB_CLK is provided. Therefore, in a case that the input clock I_CLK has a minimum cycle, there may be no over shift in the DLL device 100.

Figure 2B:
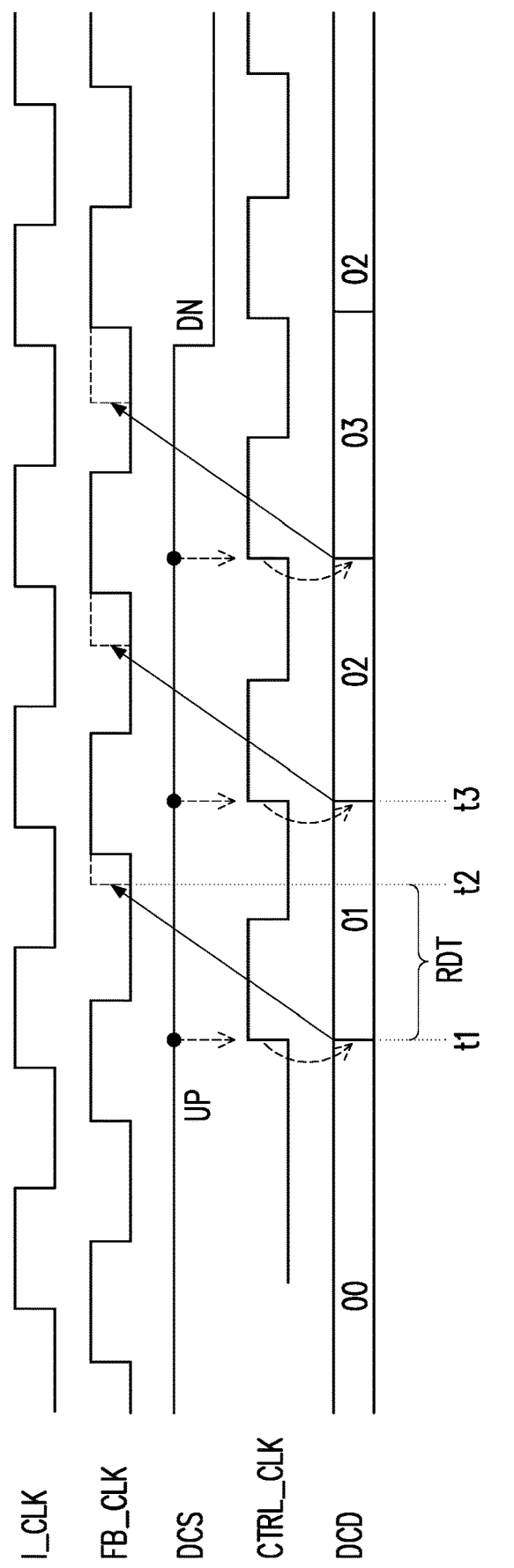
FIG. 2B is a diagram of signal timing applied to an input clock having a maximum cycle according to an embodiment of the disclosure.

For example, please refer to FIG. 1, FIG. 2A, and FIG. 2B together. FIG. 2B is a diagram of signal timing applied to an input clock having a maximum cycle according to an embodiment of the disclosure. The diagram of signal timing in FIG. 2B is also applicable to the DLL device 100. In the embodiment, the replica delay time length RDT in FIG. 2A is the same as the replica delay time length RDT in FIG. 2B. Therefore, in the embodiment, the cycle of the control clock CTRL_CLK in FIG. 2B may be equal to the cycle of the control clock CTRL_CLK shown in FIG. 2A. That is, therefore, in a case that the input clock I_CLK has a maximum cycle, the DLL device 100 adjusts the cycle of the control clock CTRL_CLK according to the replica delay time length RDT. Therefore, a time length during which the DLL device 100 adjusts the input clock I_CLK to an expected delay clock D_CLK may not be prolonged.

Figure 3A:
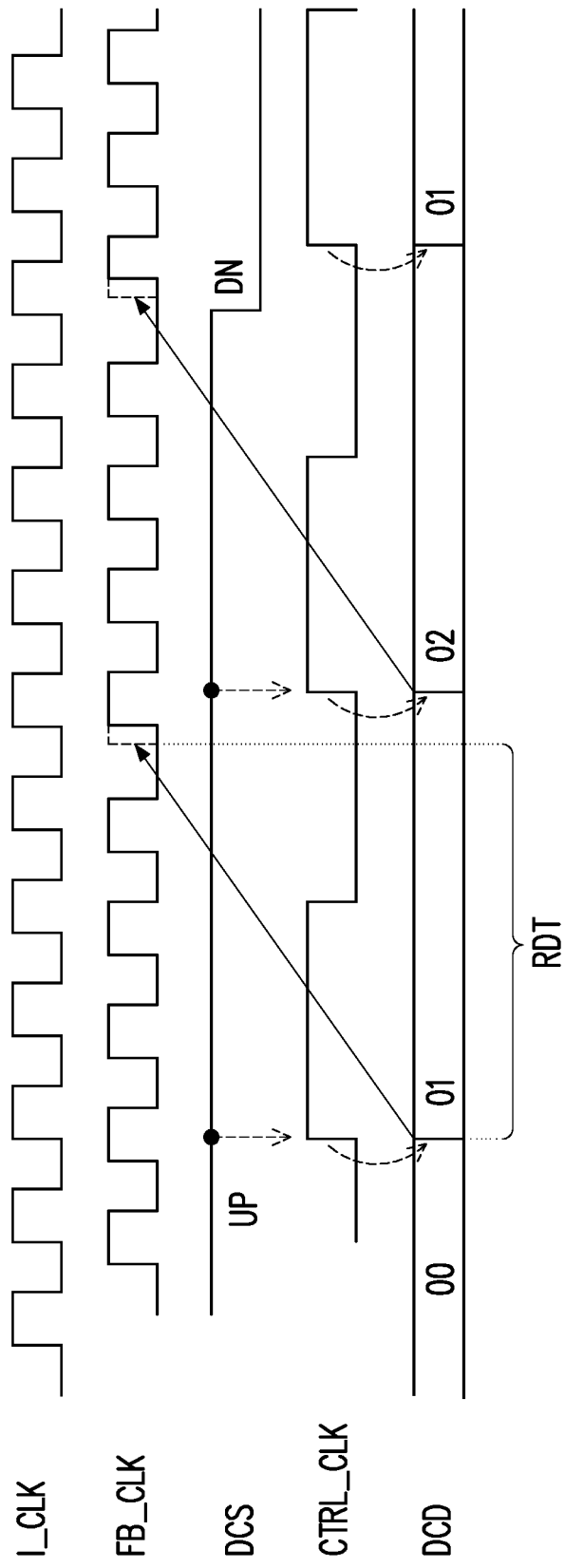
FIG. 3A is a diagram of signal timing applied to a slow skew according to an embodiment of the disclosure.
Figure 3B:
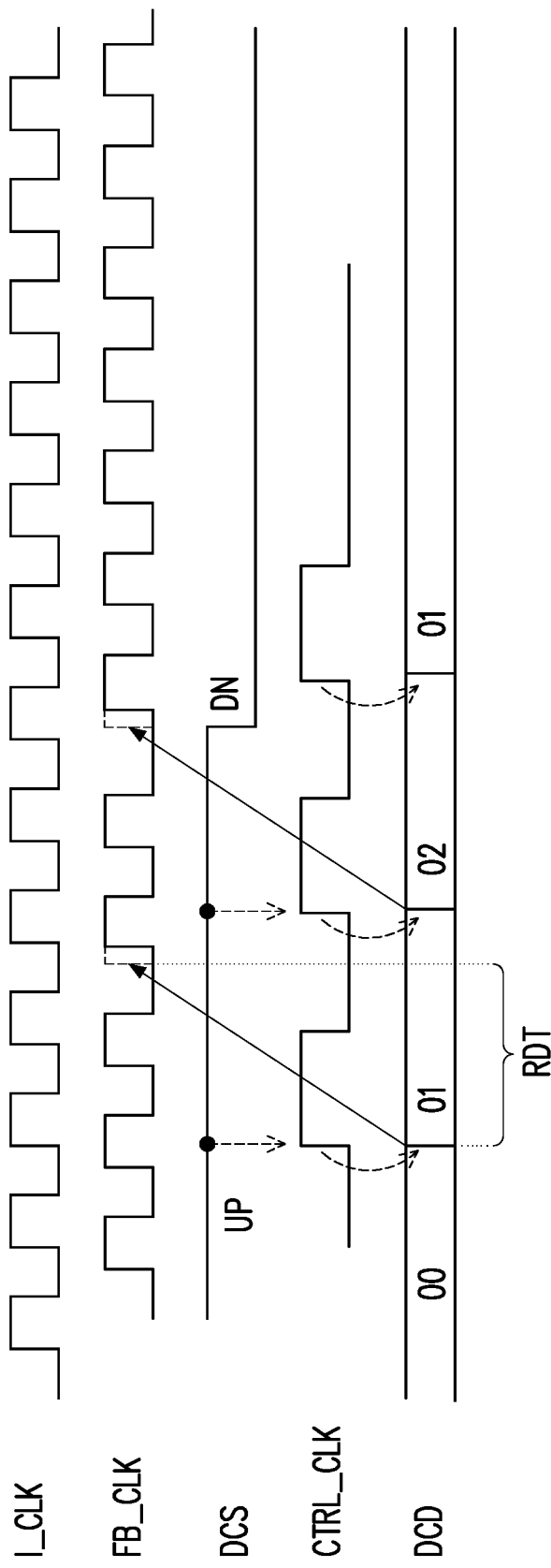
FIG. 3B is a diagram of signal timing applied to a fast skew according to an embodiment of the disclosure.

Please refer to FIG. 1, FIG. 3A, and FIG. 3B. FIG. 3A is a diagram of signal timing applied to a slow skew according to an embodiment of the disclosure. FIG. 3B is a diagram of signal timing applied to a fast skew according to an embodiment of the disclosure. The diagram of signal timing in FIG. 3A and the diagram of signal timing in FIG. 3B are also applicable to the DLL device 100. In the embodiment, the replica delay time length RDT may be adjusted according to a transistor skew generated in a manufacturing process of the DLL device 100. The transistor skew depends on a threshold voltage value in a transistor. For example, based on the manufacturing process of the DLL device 100, when a transistor of the DLL device 100 has a large threshold voltage value, this means that there is a slow skew in the DLL device 100, which may make the DLL device 100 have a large delay. The replica delay time length RDT is increased with the slow skew, as shown in FIG. 3A. Since the replica delay time length RDT is increased with the slow skew, the cycle of the control clock CTRL_CLK may also be increased.

In another example, when the transistor of the DLL device 100 has a small threshold voltage value, this means that there is a fast skew in the DLL device 100, which may make the DLL device 100 have a small delay. The replica delay time length RDT is decreased with the fast skew, as shown in FIG. 3B. Since the replica delay time length RDT is decreased with the fast skew, the cycle of the control clock CTRL_CLK may also be decreased.

Figure 4:
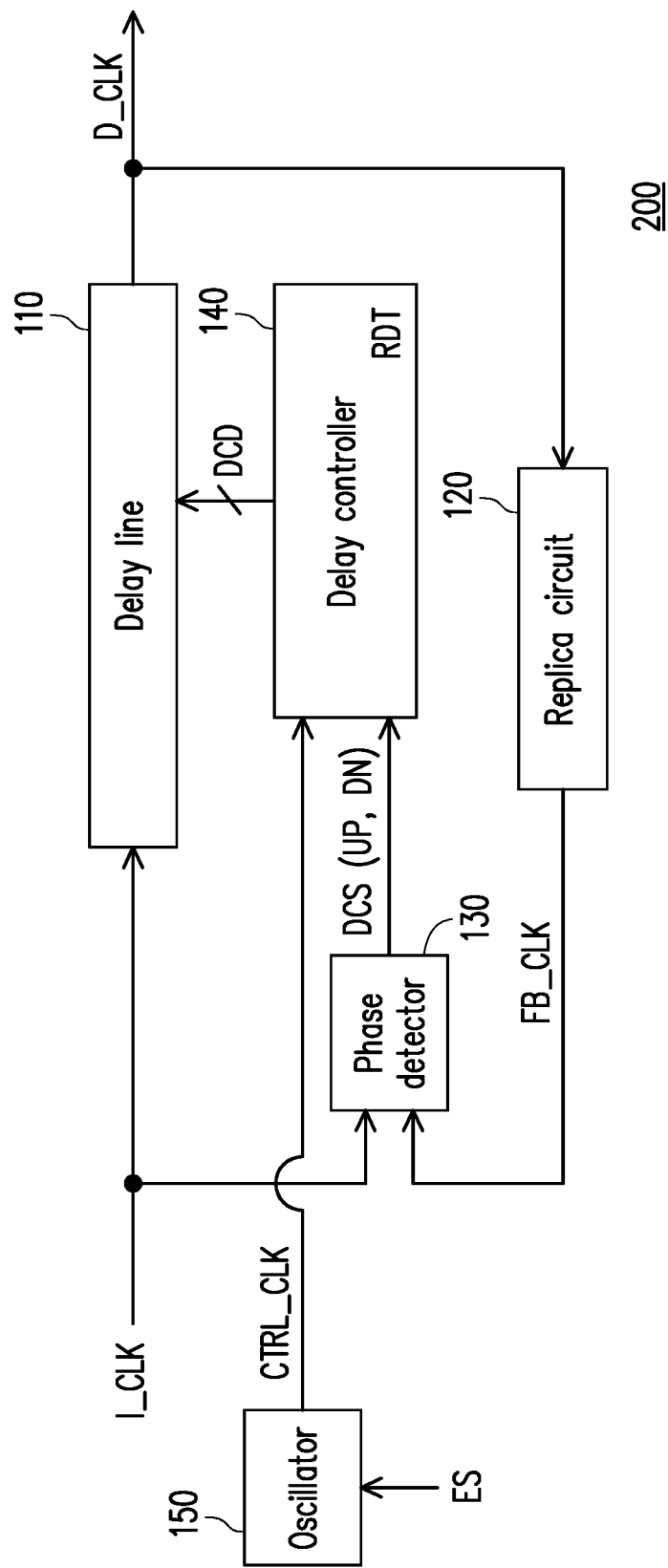
FIG. 4 is a schematic diagram of a DLL device according to a second embodiment of the disclosure.

Please refer to FIG. 4. FIG. 4 is a schematic diagram of a DLL device according to a second embodiment of the disclosure. Different from the DLL device provided in the first embodiment, a DLL device 200 provided in the second embodiment further includes an oscillator 150. In the embodiment, the oscillator 150 is coupled to the delay controller 140. The oscillator 150 provides the control clock CTRL_CLK. In the embodiment, the oscillator 150 may receive an enable signal ES. The oscillator 150 is enabled according to the enable signal ES, and then provides the control clock CTRL_CLK.

Figure 5:
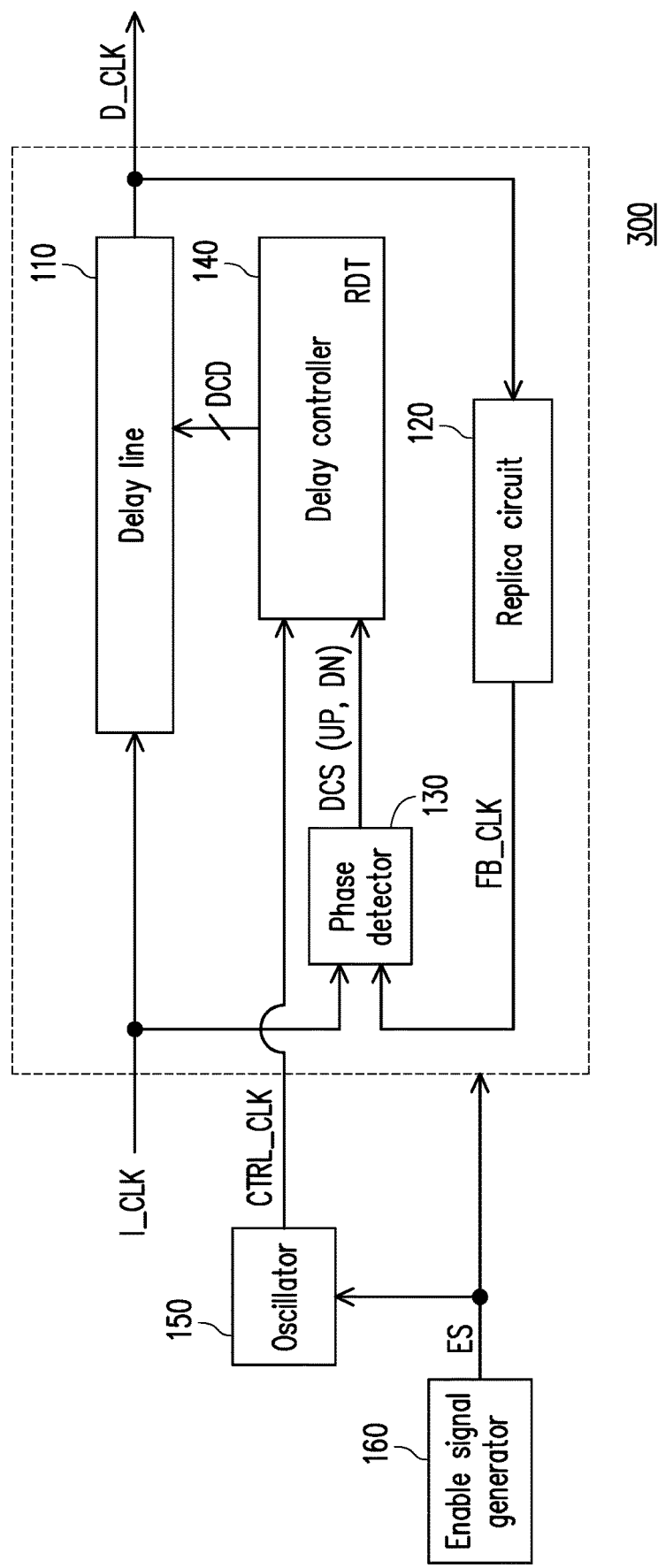
FIG. 5 is a schematic diagram of a DLL device according to a third embodiment of the disclosure.

Please refer to FIG. 5. FIG. 5 is a schematic diagram of a DLL device according to a third embodiment of the disclosure. Different from the DLL device provided in the second embodiment, a DLL device 300 provided in the third embodiment further includes an enable signal generator 160. In the embodiment, the enable signal generator 160 is coupled to the oscillator 150. The enable signal generator 160 provides the enable signal ES. In the embodiment, the enable signal generator 160 may be further coupled to the delay line 110, the replica circuit 120, the phase detector 130, and the delay controller 140. The enable signal generator 160 may also enable the delay line 110, the replica circuit 120, the phase detector 130, and the delay controller 140 according to the enable signal ES.

Figure 6:
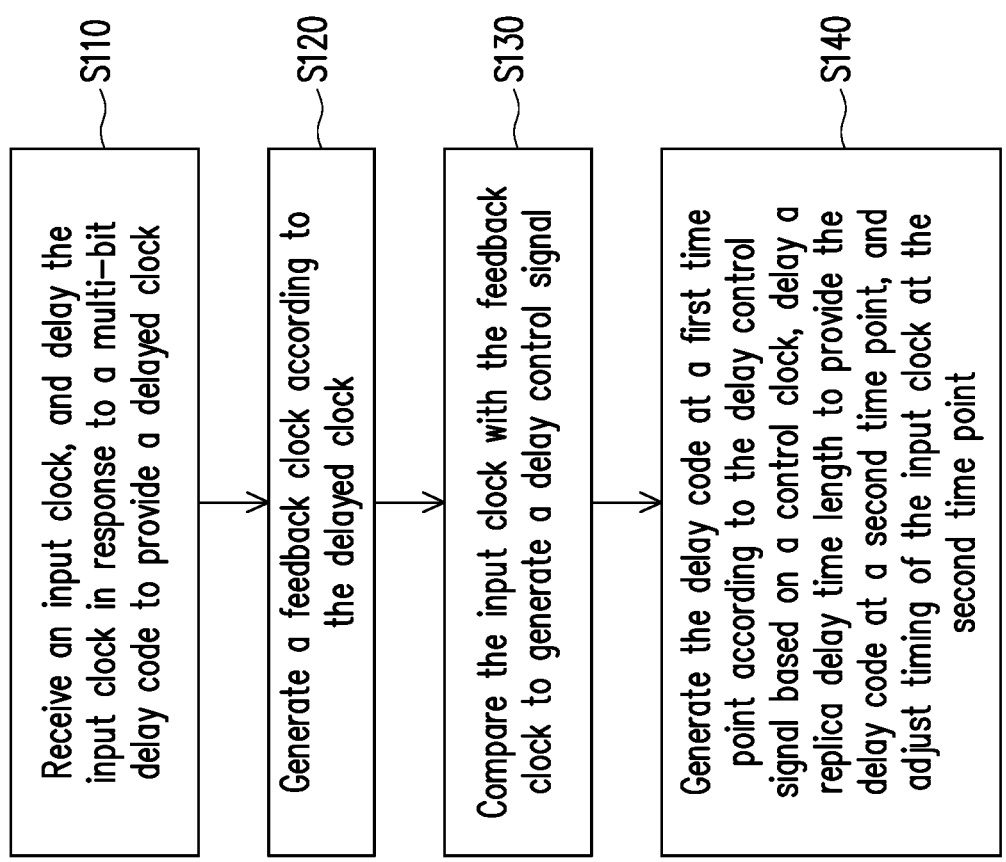
FIG. 6 is a flowchart of an operation method according to an embodiment of the disclosure.

Please refer to FIG. 1 and FIG. 6 together. FIG. 6 is a flowchart of an operation method according to an embodiment of the disclosure. In step S110, the delay line 110 may receive an input clock I_CLK, and delay the input clock I_CLK in response to a multi-bit delay code DCD to provide a delayed clock D_CLK. In step S120, the replica circuit 120 may generate a feedback clock FB_CLK according to the delayed clock D_CLK. In step S130, the phase detector 130 may compare the input clock I_CLK with the feedback clock FB_CLK to generate a delay control signal DCS. In step S140, based on a control clock, the delay controller 140 may generate the delay code DCD at a first time point according to the delay control signal DCS, and delay a replica delay time length to provide the delay code DCD at a second time point. Moreover, the delay line 110 adjusts timing of the input clock I_CLK at the second time point. Implementation details of steps S110 to S140 in the embodiment are sufficiently taught in the embodiments depicted in FIG. 1 to FIG. 3B, and thus descriptions thereof are omitted herein.

To sum up, in the DLL device and according to the operation method for the DLL device as provided in one or more embodiments of the disclosure, the cycle of the control clock is adjusted to be larger than the replica delay time length, and the delay code may be provided based on the control clock, so that the delay code adjusts a phase of the input clock after the replica delay time length. Thereby, the DLL device and the operation method provided in one or more embodiments of the disclosure are applicable to the cycle of any input clock I_CLK, and the received input clock I_CLK may be adjusted to the expected delay clock D_CLK within the specified preset cycle.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A delay-locked loop device, comprising:
   a delay line, configured to receive an input clock and delay the input clock in response to a multi-bit delay code to provide a delayed clock;
   a replica circuit, coupled to the delay line and configured to receive the delayed clock and generate a feedback clock according to the delayed clock;
   a phase detector, coupled to the replica circuit and configured to receive the input clock and the feedback clock and compare the input clock with the feedback clock to generate a delay control signal; and
   a delay controller, coupled to the phase detector and the delay line and configured to generate the delay code at a first time point according to the delay control signal based on a control clock, delay a replica delay time length to provide the delay code to the delay line at a second time point, and control the delay line to adjust timing of the input clock at the second time point,
   wherein a cycle of the control clock is adjusted to be larger than the replica delay time length.

2. The delay-locked loop device according to claim 1, wherein the delay controller provides another delay code at a third time point after the second time point based on the control clock, wherein a time length between the third time point and the first time point is substantially equal to the cycle of the control clock.

3. The delay-locked loop device according to claim 1, wherein the replica delay time length is adjusted according to a transistor skew generated in a manufacturing process of the delay-locked loop device, wherein the transistor skew depends on a threshold voltage value in a transistor.

4. The delay-locked loop device according to claim 3, wherein the replica delay time length is increased according to a slow skew in the transistor skew, and the replica delay time length is decreased according to a fast skew in the transistor skew.

5. The delay-locked loop device according to claim 1, further comprising:
   an oscillator, coupled to the delay controller and configured to provide the control clock.

6. The delay-locked loop device according to claim 5, wherein the oscillator is enabled according to an enable signal to provide the control clock.

7. The delay-locked loop device according to claim 6, further comprising:
   an enable signal generator, coupled to the oscillator and configured to provide the enable signal.

8. The delay-locked loop device according to claim 7, wherein the enable signal generator is further coupled to the delay line, the replica circuit, the phase detector, and the delay controller and enables the delay line, the replica circuit, the phase detector, and the delay controller according to the enable signal.

9. An operation method for a delay-locked loop device, comprising:
   receiving an input clock and delaying the input clock in response to a multi-bit delay code to provide a delayed clock;
   generating a feedback clock according to the delayed clock;
   comparing the input clock with the feedback clock to generate a delay control signal; and generating the delay code at a first time point according to the delay control signal based on a control clock, delaying a replica delay time length to provide the delay code at a second time point, and adjusting timing of the input clock at the second time point, wherein a cycle of the control clock is adjusted to be larger than the replica delay time length.

10. The operation method according to claim 9, further comprising:

providing another delay code at a third time point after the second time point, wherein a time length between the third time point and the first time point is substantially equal to the cycle of the control clock.

11. The operation method according to claim 9, further comprising:

adjusting the replica delay time length according to a transistor skew generated in a manufacturing process of the delay-locked loop device, wherein the transistor skew depends on a threshold voltage value in a transistor.

12. The operation method according to claim 11, wherein the replica delay time length is increased according to a slow skew in the transistor skew, and the replica delay time length is decreased according to a fast skew in the transistor skew.

13. The operation method according to claim 9, further comprising:

providing the control clock according to an enable signal.

* * * * *